(12) United States Patent
Wang

(10) Patent No.: US 6,930,530 B1
(45) Date of Patent: Aug. 16, 2005

(54) HIGH-SPEED RECEIVER FOR HIGH I/O VOLTAGE AND LOW CORE VOLTAGE

(75) Inventor: Wen-Tai Wang, Hsing-Lung Li (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/770,268

(22) Filed: Feb. 2, 2004

(51) Int. Cl.[7] ................................................ H03L 5/00
(52) U.S. Cl. .......................... 327/333; 326/80; 326/81
(58) Field of Search ......................... 327/108–112, 333, 327/434, 436, 437; 326/62–81

(56) References Cited

U.S. PATENT DOCUMENTS

| | | | |
|---|---|---|---|
| 5,786,618 A | 7/1998 | Wen | 257/391 |
| 5,911,104 A | 6/1999 | Smayling et al. | 438/202 |
| 6,275,094 B1 | 8/2001 | Cranford, Jr. et al. | 327/534 |
| 6,819,145 B2 * | 11/2004 | Swartz et al. | 327/65 |

* cited by examiner

Primary Examiner—Kenneth B. Wells
(74) Attorney, Agent, or Firm—Thomas, Kayden, Horstemeyer & Risley

(57) ABSTRACT

A receiver circuit. A reference voltage circuit is supplied with a first power supply voltage for outputting a reference voltage that is a mid-point voltage between the first power supply voltage and ground. A reference current circuit generates a first current according to the reference voltage. A receiving circuit is supplied with a second power supply voltage higher than the first power supply voltage, including a first current source for generating a second current according to the first current, and a differential amplifier circuit for generating an output signal contained within a voltage range of the first power supply voltage and centered around the mid-point voltage of the first power supply voltage according to the second current.

20 Claims, 3 Drawing Sheets

HIGH-SPEED RECEIVER FOR HIGH I/O VOLTAGE AND LOW CORE VOLTAGE

BACKGROUND OF THE INVENTION

1. Field of the Invention

The present invention relates in general to semiconductor memory. In particular, the present invention relates to peripheral circuitry for high-speed receivers connected to high I/O voltages.

2. Description of the Related Art

An input-output (I/O) signal to a semiconductor device is usually a small amplitude signal within a large DC voltage range. In order to accommodate the high DC voltage, thick oxide devices are used. The receiving circuits comprising thick oxide devices to form amplifying stages, have limited performance because of large gate and junction capacitances. The receiving circuits comprising thin oxide devices to form amplifying stages and process high voltage I/O signals, are complicated circuits requiring special circuit techniques to ensure that the thin oxide devices avoid high voltage stress. Receiving circuits that transform signals from a high I/O voltage (VDDQ) to a low core (internal circuit) voltage (VDD) cause large delay skew between the rising and falling edges as VDDQ and VDD are independent.

U.S. Pat. No. 6,275,094 discloses a device to shift the threshold voltage in a receiver, which has both thick and thin oxide regions. The circuitry of the receiver contains a plurality of inverters and two feedback paths. U.S. Pat. No. 6,181,193 discloses a high voltage tolerant CMOS input and output interface circuit. A receiving circuit comprises a thick oxide CMOS with dual gate devices in a receiver and a driver. U.S. Pat. No. 5,911,104 discloses a chip design having thick and thin oxide and forms both bipolar transistors and DMOS transistors on the same chip. A high radio frequency receiver circuit is discussed which creates high voltage control signals. U.S. Pat. No. 5,786,618 discloses a high voltage charge pump and receiver on a dual gate oxide substrate. An N-isolation buried layer underlying high density and low voltage transistors define islands of arbitrary voltage on a substrate allowing the resulting circuits to operate at high voltage relative to the substrate.

SUMMARY OF THE INVENTION

It is an object of the present invention to adjust the common mode voltage at the output of a receiver circuit to center an I/O signal around the switching point voltage of the subsequent internal circuits.

It is another object of the present invention to construct a receiver circuit from thick oxide devices and construct the subsequent circuits driven by the receiver from thin oxide devices.

It is still another object of the present invention to create a reference voltage that approximates the switching point voltage of internal (core) circuits using thin oxide devices.

It is yet another object of the present invention to control a current in the receiver circuit to be proportional to the switching point voltage of subsequent circuits driven by the receiver circuit, and thereby center the I/O signal around the switching voltage of the subsequent circuits.

It is still yet another object of the present invention to improve the performance of an I/O receiver circuit by constructing subsequent stages driven by the I/O receiver with thin oxide devices and by reducing the rising and falling transition skew of the signal connected to the subsequent receiver stages.

To achieve the above-mentioned objects, the present invention provides a receiver circuit. A reference voltage circuit is supplied with a first power supply voltage for outputting a reference voltage that is a mid-point voltage between the first power supply voltage and ground. A reference current circuit generates a first current according to the reference voltage. A receiving circuit is supplied with a second power supply voltage higher than the first power supply voltage, including a first current source for generating a second current according to the first current, and a differential amplifier circuit for generating an output signal contained within a voltage range of the first power supply voltage and centered around the mid-point voltage of the first power supply voltage according to the second current.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
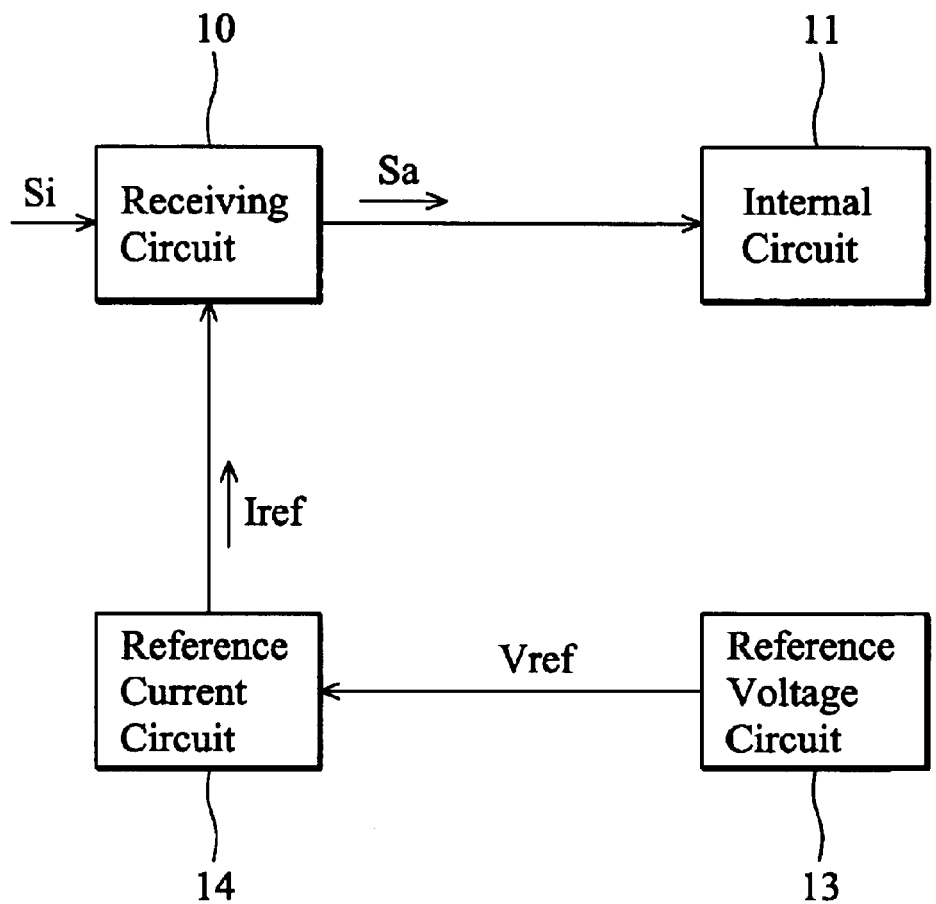
FIG. 1 shows a block diagram of the I/O receiver circuit coupled to an internal (core) circuit of the present invention.
Figure 2:
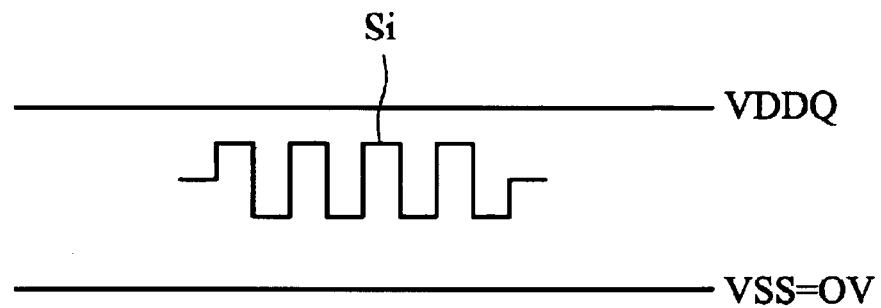
FIG. 2 shows a signal within the DC operating range of the I/O circuitry.
Figure 3:
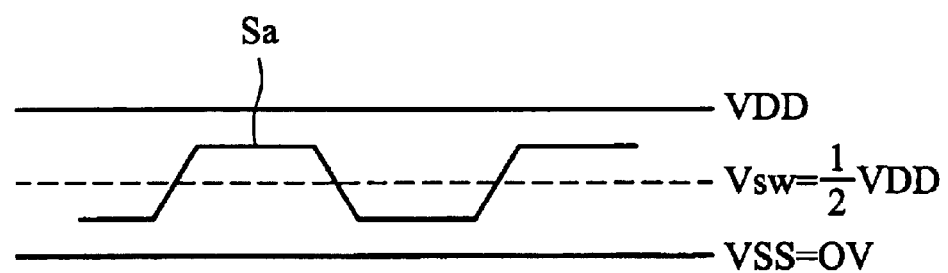
FIG. 3 shows the output signal of the receiver circuit centered around the switching point voltage within the voltage range of the internal circuits.

FIG. 1 shows a block diagram of the present invention. An I/O signal Si shown in FIG. 2 is provided to the input of the receiving circuit 10. The receiving circuit 10 is formed with thick oxide transistors and outputs an amplified I/O signal Sa shown in FIG. 3 to a internal circuit (core circuit) 11 formed with thin oxide transistors. The input I/O signal Si is within a DC voltage range of 0V to VDDQ as shown in FIG. 2. The amplified I/O signal Sa produced at the output of the receiving circuit 10 is centered around a switching point voltage Vsw of the internal circuit 11 and falls within the DC voltage range of 0V to VDD as shown in FIG. 3.

A reference voltage Vref is generated by a reference voltage circuit 13 formed by thin oxide transistors with the same manufacturing parameters as transistors used in the internal circuit 11. Here, the voltage VDD shown in FIG. 3 is provided to the reference voltage circuit 13 and the value of the reference voltage Vref generated by the reference voltage circuit 13 is centered around the value of half VDD, close to voltage Vsw.

Thus, the switching point voltage Vsw of the internal circuit 11 is tracked by the reference voltage Vref. The reference voltage Vref is transformed to the reference current Iref proportional to the reference voltage Vref. The reference current circuit 14 is formed from thick oxide devices similar to those used in the receiving circuit 10. A current is established within the receiving circuit 10 by means of a current mirror or equivalent circuitry. The current in the receiving circuit produces a DC voltage at the output of the receiving circuit 10 around which the amplified I/O signal Sa is centered. Thus the receiving circuit 10 tracks the switching point voltage Vsw of the internal circuit 11 and balances the raising and falling delay of the amplified I/O signal Sa to improve performance of the receiving circuit 10. Here, the switching point voltage Vsw represents a threshold voltage of the transistors in the internal circuit.

Figure 4:
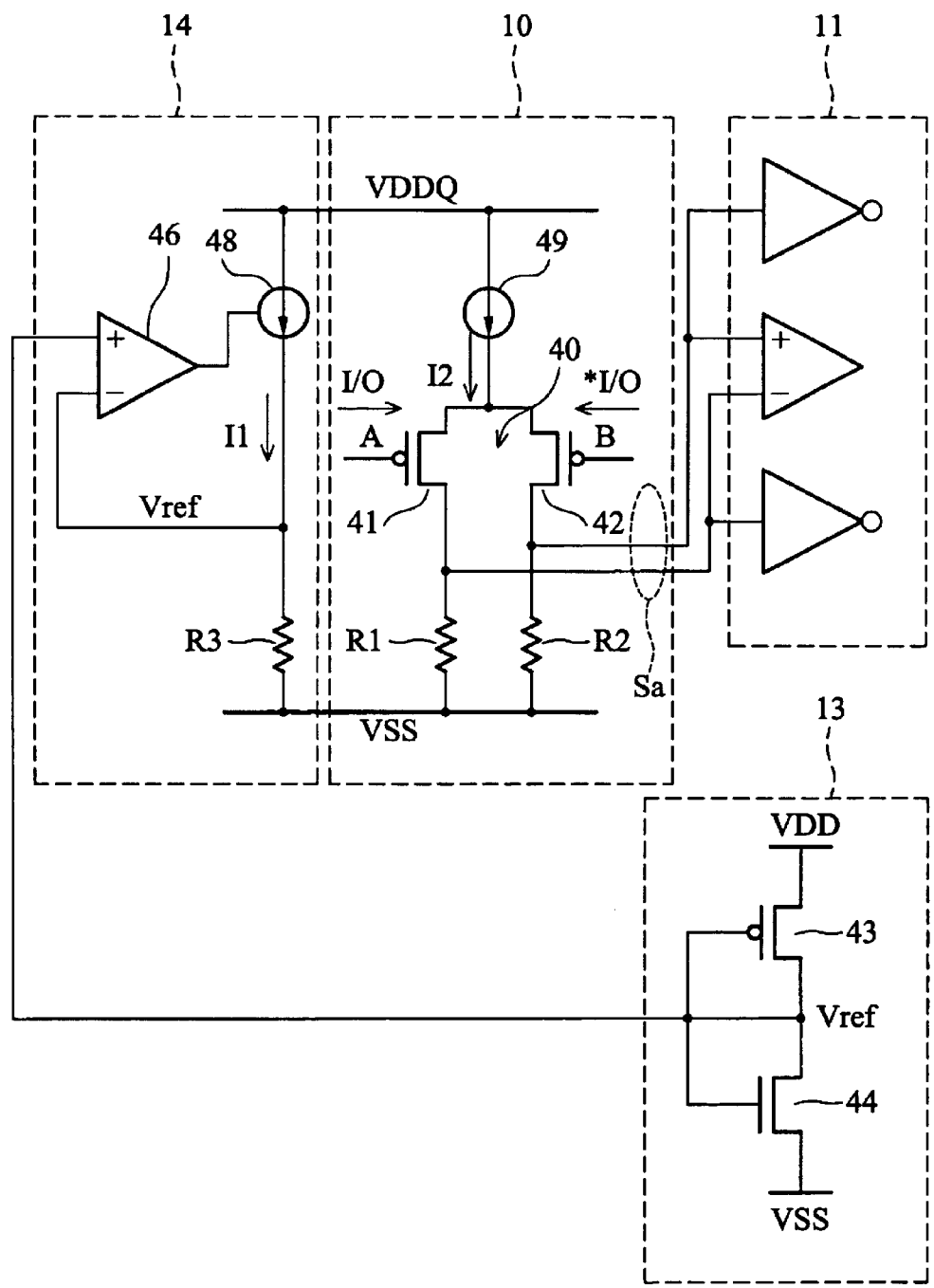
FIG. 4 is a circuit diagram of the I/O receiver circuit of the present invention.

FIG. 4 shows a circuit diagram of the receiver system according to the embodiment of the present invention. The reference voltage circuit 13 comprises a PMOS transistor 43 and a NMOS transistor 44 having the same p/n ratio as the transistors in the internal circuit 11. Thus, a reference voltage Vref, which is approximately VDD/2, is produced in reference voltage circuit 13, for example, a voltage divider. It is noted that the voltage VDD is lower than the voltage VDDQ. In addition, the voltage divider is formed from thin oxide devices and between internal circuit voltages VDD and VSS (ground). Because the PMOS transistor 43 and the NMOS transistor 44 are created with the same p/n ratio as transistors in the internal circuit 11 and are also supplied voltages between internal circuit voltages VDD and VSS, the reference voltage Vref generated by the voltage divider closely tracks the switching point voltage Vsw of the internal circuits 11, which is approximately VDD/2. Here, the gates of the PMOS transistor 43 and the NMOS transistor 44 are connected to the drains of the PMOS transistor 43 and the NMOS transistor 44. In addition, the reference voltage Vref is coupled to a reference current circuit 14 comprising a resistor R3, an adjustable current source 48 and a comparator circuit 46. The comparator circuit 46 comprises a reverse input terminal, a non-reverse input terminal coupled to the gates of the PMOS transistor 43 and the NMOS transistor 44, and an output terminal. The resistor R3 is coupled between the reverse input terminal of the comparator circuit 46 and VSS (ground). The current source 48 is coupled between VDDQ and the resistor R3 for generating the current I1 flowing through the resistor R3 and generating the mid-point voltage at the connection point of the resistor R3 and the reverse input terminal of the comparator circuit 46.

Here, the comparator circuit 46 adjusts the current source 48 to make the voltage drop across the resistor R3 equal to reference voltage Vref, which is close to the mid-point voltage Vsw.

A differential amplifier circuit 40 comprises an adjustable current source 49, thick oxide PMOS transistor input pair and two resistor loads R1 and R2, having the same resistance (R/k). The PMOS transistor 41 comprising a source coupled to the current source 49, a gate coupled to an I/O signal I/O, and a drain. The PMOS transistor 42 comprises a source coupled to the current source 49, a gate coupled to a reverse I/O signal *I/O, and a drain. The resistor R1 is coupled between the connection point of the drain of the PMOS-transistor 41 and the internal circuit, and VSS (ground). The resistor R2 is coupled between the connection point of the drain of the PMOS transistor 42 and the internal circuit, and VSS (ground). The current I2 (2·k·I1) of the differential amplifier circuit 40 is referenced to the reference current I1 of the reference current circuit 14 by a current mirror or equivalent circuitry. For example, parameter k can be "2" thus the current I2 is double the current I1.

The differential amplifier circuit 40 receives a differential signal I/O at inputs A and B. The output signal Sa of the differential amplifier circuit 40 is developed across the resistor loads R1 and R2 in both legs of the differential amplifier circuit 40 and are coupled to thin oxide devices of the core (internal) circuit 11. Here, the voltage level of the output signal Sa of the differential amplifier circuit 40 is clamped to (2·k·I1)·(R1/k)=2Vsw=VDD and the middle point of that is always at Vsw=VDD/2. The output signal Sa of the differential amplifier circuit 40 comprises the sum of a voltage Vref created by the current I2 flowing through the two resistors R1 and R2 of the differential amplifier circuit 40 and the amplified I/O signal as shown in FIG. 3. Since the rising and falling transitions of the output signal Sa of the differential amplifier circuit 40 are centered around the switching point of the internal circuits 11, the performance of the switching of the internal circuit 11 is improved. Thus, the rising/falling delay skew of the amplified I/O signal Sa is dramatically reduced.

Accordingly, the high-speed receiver for high I/O voltage and low core voltage of the present invention combines thick and thin oxide devices to make the circuits compact and meet high input common mode voltage and speed requirements, and the signals output to thin oxide devices are clamped to core voltage to avoid high voltage stress.

The foregoing description of the invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A receiver circuit for outputting signals to an internal circuit supplied with a first power supply voltage, comprising:
   a reference voltage circuit supplied with the first power supply voltage for outputting a reference voltage that is a mid-point voltage between the first power supply voltage and ground;
   a reference current circuit for generating a first current according to the reference voltage; and
   a receiving circuit supplied with a second power supply voltage higher than the first power supply voltage, comprising:
      a first current source for generating a second current according to the first current; and
      a differential amplifier circuit for generating an output signal contained within a voltage range of the first power supply voltage and centered around the mid-point voltage to the internal circuit according to the second current.

2. The receiver circuit as claimed in claim 1, wherein the internal circuit comprises a plurality of transistors having a first gate oxide thickness.

3. The receiver circuit as claimed in claim 2, wherein the reference voltage circuit comprises a first PMOS transistor and a first NMOS transistor having the first gate oxide thickness.

4. The receiver circuit as claimed in claim 3, wherein the first PMOS transistor and the first NMOS transistor have a first p/n ratio.

5. The receiver circuit as claimed in claim 4, wherein the transistors of the internal circuit have the first p/n ratio.

6. The receiver circuit as claimed in claim 3, wherein the first PMOS transistor and the first NMOS transistor are connected in serial and between the first power supply voltage and ground, and the gates and the drains of the first PMOS transistor and the first NMOS transistor are connected.

7. The receiver circuit as claimed in claim 4, wherein the reference current circuit comprises:
- a comparator circuit having a reverse input terminal, a non-reverse input terminal coupled to the gates of the first PMOS transistor and the first NMOS transistor, and an output terminal;
- a first resistor coupled between the reverse input terminal and ground; and
- a second current source coupled between the second power supply voltage and the first resistor for generating the first current flowing through the first resistor and generating the mid-point voltage at the connection point of the first resistor and the reverse input terminal.

8. The receiver circuit as claimed in claim 1, wherein the second current is referenced to the first current by a current mirror or equivalent circuitry.

9. The receiver circuit as claimed in claim 7, wherein the differential amplifier circuit comprises:
- a second PMOS transistor having a first source coupled to the second current source, a first gate coupled to an I/O signal, and a first drain;
- a third PMOS transistor having a second source coupled to the second current source, a second gate coupled to a reverse I/O signal, and a second drain;
- a second resistor coupled between the connection point of the first drain and the internal circuit, and ground; and
- a third resistor coupled between the connection point of the second drain and the internal circuit, and ground.

10. The receiver circuit as claimed in claim 7, wherein the second and third PMOS transistors have a second gate oxide thickness larger than the first gate oxide thickness.

11. The receiver circuit as claimed in claim 9, wherein the resistances of the second and third resistor are the same.

12. The receiver circuit as claimed in claim 1, wherein the mid-point voltage is approximately a switching point voltage of the internal circuit.

13. A receiver circuit, comprising:
- an internal circuit supplied with a first power supply voltage and comprising a plurality of transistors having a first p/n ratio and a first gate oxide thickness;
- a reference voltage circuit supplied with the first power supply voltage and comprising a first PMOS transistor and a first NMOS transistor having a first p/n ratio and the first gate oxide thickness, for outputting a reference voltage that is a mid-point voltage between the first power supply voltage and ground;
- a reference current circuit for generating a first current according to the reference voltage; and
- a receiving circuit supplied with a second power supply voltage higher than the first power supply voltage, comprising:
  - a first current source for generating a second current according to the first current; and
  - a differential amplifier circuit for generating an output signal contained within a voltage range of the first power supply voltage and centered around the mid-point voltage to the internal circuit according to the second current.

14. The receiver circuit as claimed in claim 13, wherein the first PMOS transistor and the first NMOS transistor are connected in serial and between the first power supply voltage and ground, and the gates and the drains of the first PMOS transistor and the first NMOS transistor are connected.

15. The receiver circuit as claimed in claim 13, wherein the reference current circuit comprises:
- a comparator circuit having a reverse input terminal, a non-reverse input terminal coupled to the gates of the first PMOS transistor and the first NMOS transistor, and an output terminal;
- a first resistor coupled between the reverse input terminal and ground; and
- a second current source coupled between the second power supply voltage and the first resistor for generating the first current flowing through the first resistor and generating the mid-point voltage at the connection point of the first resistor and the reverse input terminal.

16. The receiver circuit as claimed in claim 13, wherein the second current is referenced to the first current by a current mirror or equivalent circuitry.

17. The receiver circuit as claimed in claim 15, wherein the differential amplifier circuit comprises:
- a second PMOS transistor having a first source coupled to the second current source, a first gate coupled to an I/O signal, and a first drain;
- a third PMOS transistor having a second source coupled to the second current source, a second gate coupled to a reverse I/O signal, and a second drain;
- a second resistor coupled between the connection point of the first drain and the internal circuit, and ground; and
- a third resistor coupled between the connection point of the second drain and the internal circuit, and ground.

18. The receiver circuit as claimed in claim 17, wherein the second and third PMOS transistors have a second gate oxide thickness larger than the first gate oxide thickness.

19. The receiver circuit as claimed in claim 17, wherein the resistances of the second and third resistor are the same.

20. The receiver circuit as claimed in claim 13, wherein the mid-point voltage is approximately a switching point voltage of the internal circuit.

* * * * *